United States Patent
La et al.

(10) Patent No.: US 6,819,616 B2
(45) Date of Patent: Nov. 16, 2004

(54) SERIAL TO PARALLEL DATA INPUT METHODS AND RELATED INPUT BUFFERS

(75) Inventors: One-gyun La, Suwon (KR); Hyun-Wook Lim, Sungnam (KR)

(73) Assignee: Samsung Electronics Co., LTD, Kyungki-do (KR)

( * ) Notice: Subject to any disclaimer, the term of this patent is extended or adjusted under 35 U.S.C. 154(b) by 0 days.

(21) Appl. No.: 10/337,688

(22) Filed: Jan. 7, 2003

(65) Prior Publication Data

US 2003/0179619 A1 Sep. 25, 2003

(30) Foreign Application Priority Data

Mar. 25, 2002 (KR) ........................................ 2002-16164

(51) Int. Cl.[7] ................................................ G11C 7/00
(52) U.S. Cl. ................................... 365/219; 365/230.08
(58) Field of Search ............................ 365/219, 230.08

(56) References Cited

U.S. PATENT DOCUMENTS

| | | | |
|---|---|---|---|
| 4,386,367 A | * 5/1983 | Peterson et al. | ............. 348/446 |
| 6,178,139 B1 | 1/2001 | Hirobe et al. | ............... 365/233 |
| 6,229,757 B1 | 5/2001 | Nagata et al. | ............... 365/233 |

OTHER PUBLICATIONS

Samsung Electronics: "Key Points for Controller Design" DDR SDRAM/SGRAM Application Note, MPP–JLEE–Q4–98.

* cited by examiner

Primary Examiner—M. Tran
(74) Attorney, Agent, or Firm—Myers Bigel Sibley & Sajovec (57) ABSTRACT

Data can be buffered for an integrated circuit memory device by converting a plurality of serial data bits into a parallel format such that even ones of the plurality of serial data bits are provided at a first conversion output node and odd ones of the plurality of serial data bits are provided at a second conversion output node wherein a first odd data bit, a first even data bit, a second odd data bit, and a second even data bit comprise four consecutive data bits of the plurality of serial data bits. The first even and odd data bits from the first and second conversion output nodes are provided at first and second latch output nodes during a first period of time, and the second even and odd data bits from the first and second conversion output nodes are provided at third and fourth latch output nodes during a second period of time wherein the first and second periods of time are non-overlapping. The first even and odd data bits are latched at first and second buffer output nodes responsive to providing the first even and odd data bits at the first and second latch output nodes, and the second even and odd data bits are latched at the first and second buffer output nodes responsive to providing the second even and odd data bits at the third and fourth latch output nodes. Related input buffers are also discussed.

41 Claims, 4 Drawing Sheets

SERIAL TO PARALLEL DATA INPUT METHODS AND RELATED INPUT BUFFERS

RELATED APPLICATIONS

This application claims priority from Korean Patent Application No. 2002-16164, filed on Mar. 25, 2002, the disclosure of which is herein incorporated by reference in its entirety.

FIELD OF THE INVENTION

The present invention relates to memory devices, and more particularly, to data input methods and buffers for semiconductor memory devices.

BACKGROUND OF THE INVENTION

In a DDR SDRAM (Double Data Rate Synchronous Dynamic Random Access Memory), tDQSS is defined to provide successful write operations. Here, tDQSS denotes a delay time between a first rising edge of data strobe signal (DQS), and a rising edge of a clock to which a write command is input.

A DDR SDRAM may be required to normally perform write operations in a minimum tDQSS or a maximum tDQSS. The standard specification provides that the minimum tDQSS is 0.75 tCK, and the maximum tDQSS is 1.25 tCK. Here, tCK indicates a time required for a clock cycle, and a tDQSS window denotes a difference between the maximum tDQSS and the minimum tDQSS.

Figure 1:
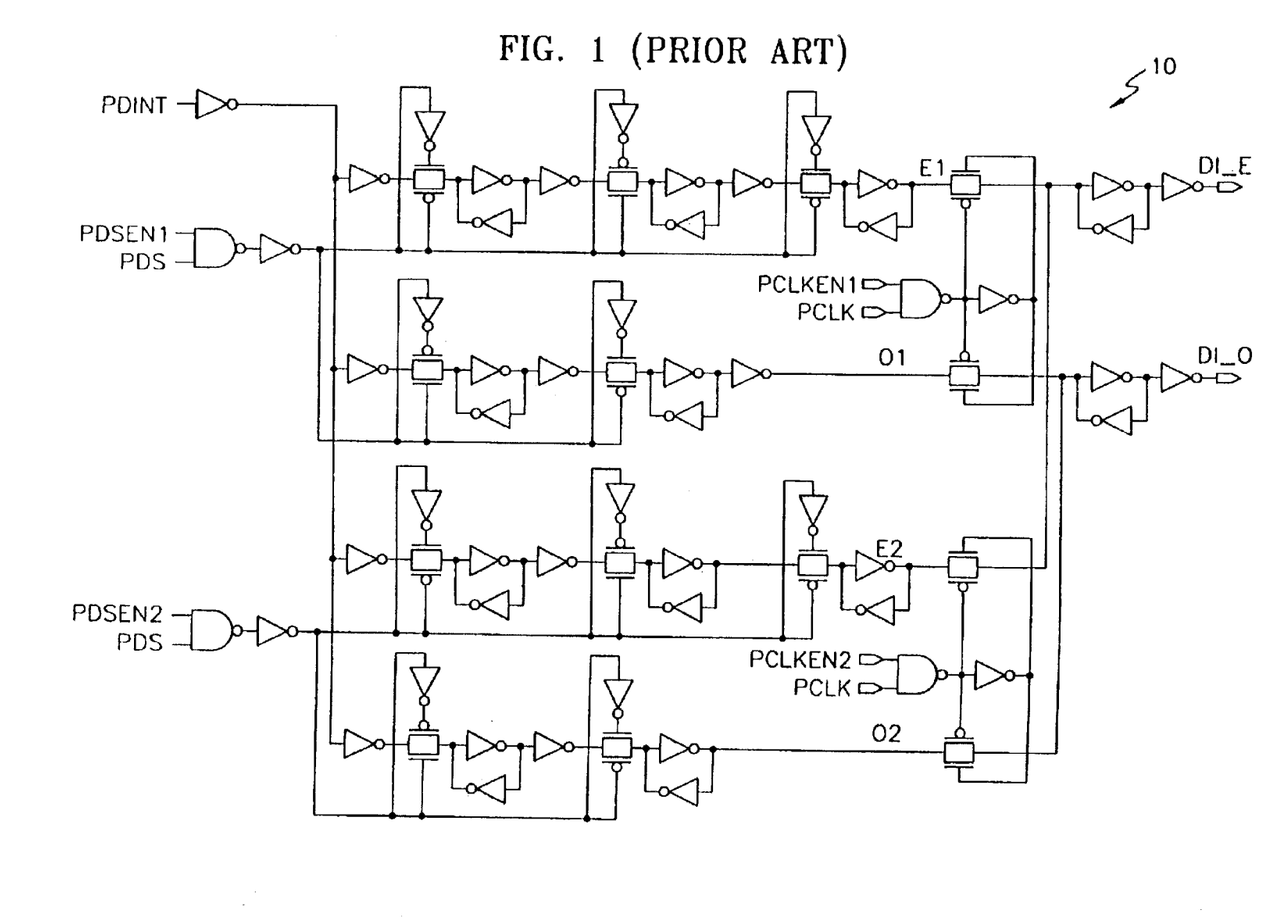
FIG. 1 is a circuit diagram of an example of a conventional data input buffer.

FIG. 1 is a circuit diagram of an example of a conventional data input buffer. Referring to FIG. 1, a data input buffer 10 divides serial data PDINT into even data E1 and E2 and odd data O1 and O2, and outputs the even and odd data in response to a data strobe signal PDS and control signals PDSEN1 and PDSEN2.

The even data E1 and E2 are output to a data input line DI_E in response to an internal clock signal PCLK and a control signal PCLKEN1, and the odd data O1 and O2 are output to a data input line DI_0 in response to the internal clock signal PCLK and a control signal PCLKEN2.

The data input buffer 10 includes a plurality of inverters and a plurality of transmission gates, which may require a very large layout area.

Figure 2:
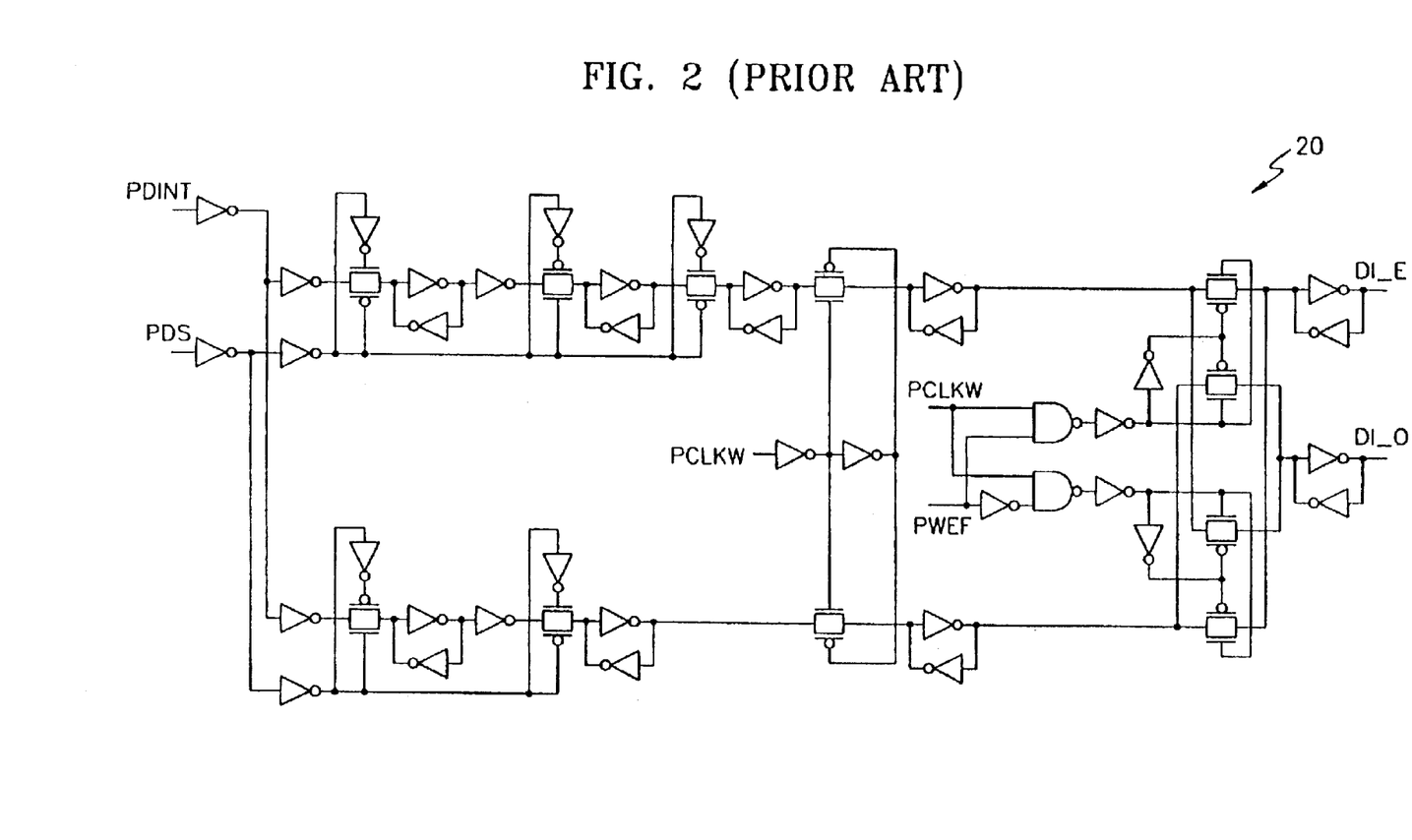
FIG. 2 is a circuit diagram of another example of a conventional data input buffer.

FIG. 2 is a circuit diagram of another example of a conventional data input buffer. Referring to FIG. 2, a data input buffer 20 divides serial data PDINT into even data and odd data, and latches the even and odd data in response to a data strobe signal PDS. The latched data is output to data input lines DI_E and DI_0.

A tDQSS window of the data input buffer 20, however, may be so small that it may barely satisfy requirements of the standard specification. Therefore, the data input buffer 20 may not normally perform write operations in the minimum tDQSS and the maximum tDQSS.

SUMMARY OF THE INVENTION

According to embodiments of the present invention, methods of buffering data for an integrated circuit memory device can include converting a plurality of serial data bits into a parallel format such that even ones of the plurality of serial data bits are provided at a first conversion output node and odd ones of the plurality of serial data bits are provided at a second conversion output node wherein a first odd data bit, a first even data bit, a second odd data bit, and a second even data bit comprise four consecutive data bits of the plurality of serial data bits. The first even and odd data bits from the first and second conversion output nodes can be provided at first and second latch output nodes during a first period of time, and the second even and odd data bits from the first and second conversion output nodes can be provided at third and fourth latch output nodes during a second period of time wherein the first and second periods of time are non-overlapping. The first even and odd data bits can be latched at first and second buffer output nodes responsive to providing the first even and odd data bits at the first and second latch output nodes. The second even and odd data bits can be latched at the first and second buffer output nodes responsive to providing the second even and odd data bits at the third and fourth latch output nodes.

DETAILED DESCRIPTION

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Terms used herein are to be given their ordinary meaning unless explicitly defined otherwise herein.

Figure 3:
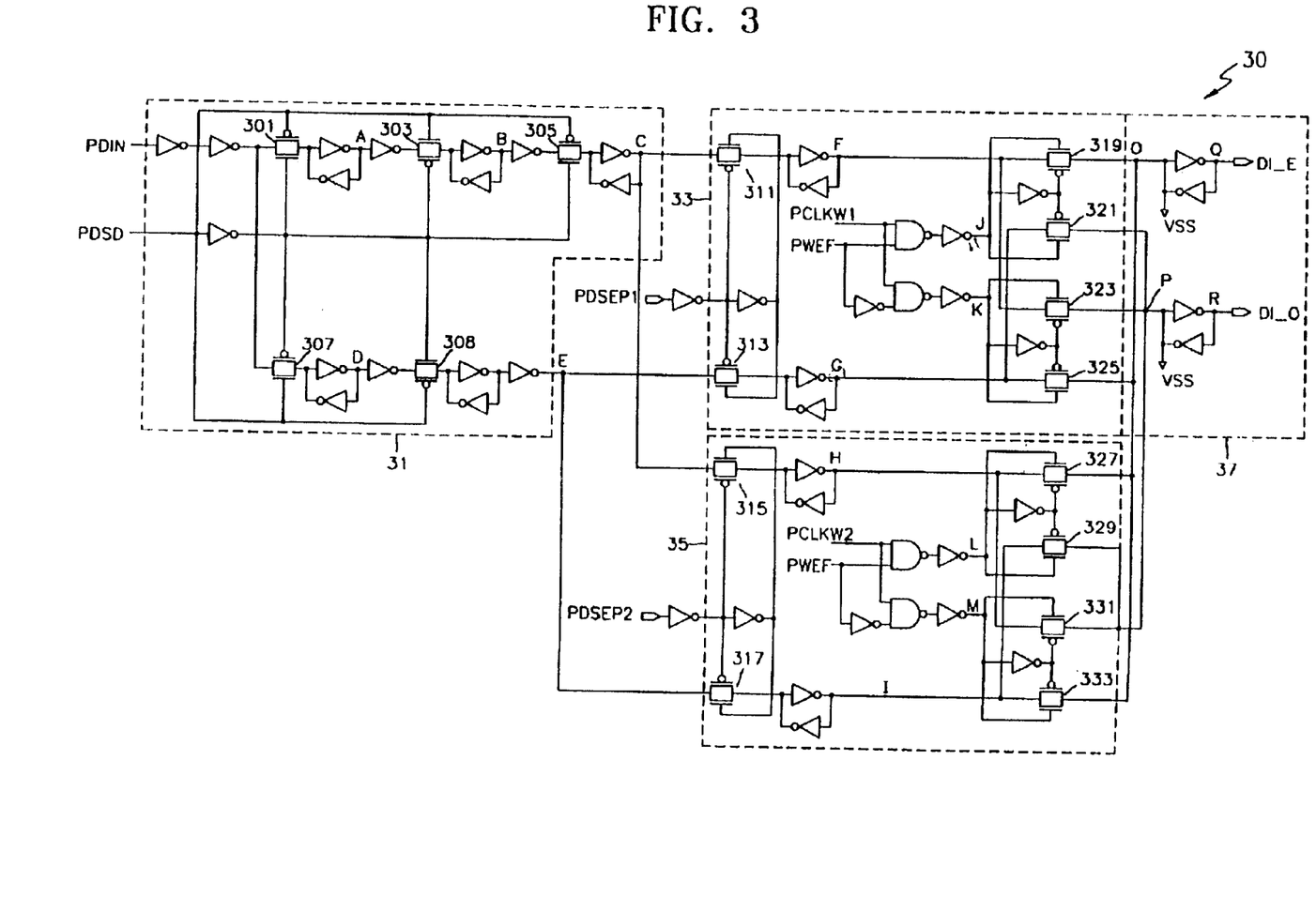
FIG. 3 is a circuit diagram of data input buffers according to embodiments of the present invention.

FIG. 3 is a circuit diagram of data input buffers according to embodiments of the present invention. Referring to FIG. 3, a data input buffer 30 includes a conversion circuit 31, a first latch circuit 33, a second latch circuit 35 and an output latch 37.

The conversion circuit 31 converts serial data bits PDIN into parallel data and outputs the parallel data to nodes C and E in response to an internal data strobe signal PDSD. Here, the data input buffer 30 is an example of a data transmission circuit, and thus, connection relationships between inverters and other logic circuits and transistors illustrated in FIG. 3 will be understood by those skilled in the art.

The first latch circuit 33 outputs signals or data bits, which are received through the nodes C and E, to nodes F and G, respectively, in response to a first control signal PDSEP1. Then, the first latch circuit 33 outputs signals, which are received through the nodes F and G, to nodes O and P, respectively, in response to a first write signal PCLKW1 and a write order control signal PWEF. Preferably, the first control signal PDSEP1 is activated prior to the first write signal PCLKW1. The first latch circuit 33 is an example of a transmission circuit, and can transmit a first group of parallel data bits, e.g., data bits output from the nodes F and G, to the corresponding nodes O and P, respectively, in response to the first write signal PCLKW1.

The second latch circuit 35 outputs signals or data bits, which are received through the nodes C and E, to nodes H and I, respectively, in response to a second control signal PDSEP2. The second latch circuit outputs signals from the nodes H and I to the nodes O and P, respectively, in response to a second write signal PCLKW2 and the write order control signal PWEF. Preferably, the second control signal PDSEP2 can be activated prior to the second write signal PCLKW2.

The second latch circuit 35 is an example of a transmission circuit, and can transmit a second group of parallel data bits, e.g., data bits output from the nodes H and I, to the nodes O and P, respectively, in response to the second write signal PCLKW2. Preferably, the first write signal PCLKW1 and the second write signal PCLKW2 are alternately activated with a predetermined time difference therebetween.

The output latch 37 latches signals from the nodes O and P, respectively. As a result, odd data bits out of the serial data bits PDIN are output to a first write driver (not shown) via a first output terminal DI_E of the output latch 37, and even data bits out of the serial data bits PDIN are output to a second write driver (not shown) via a second output terminal DI_O of the output latch 37.

Figure 4:
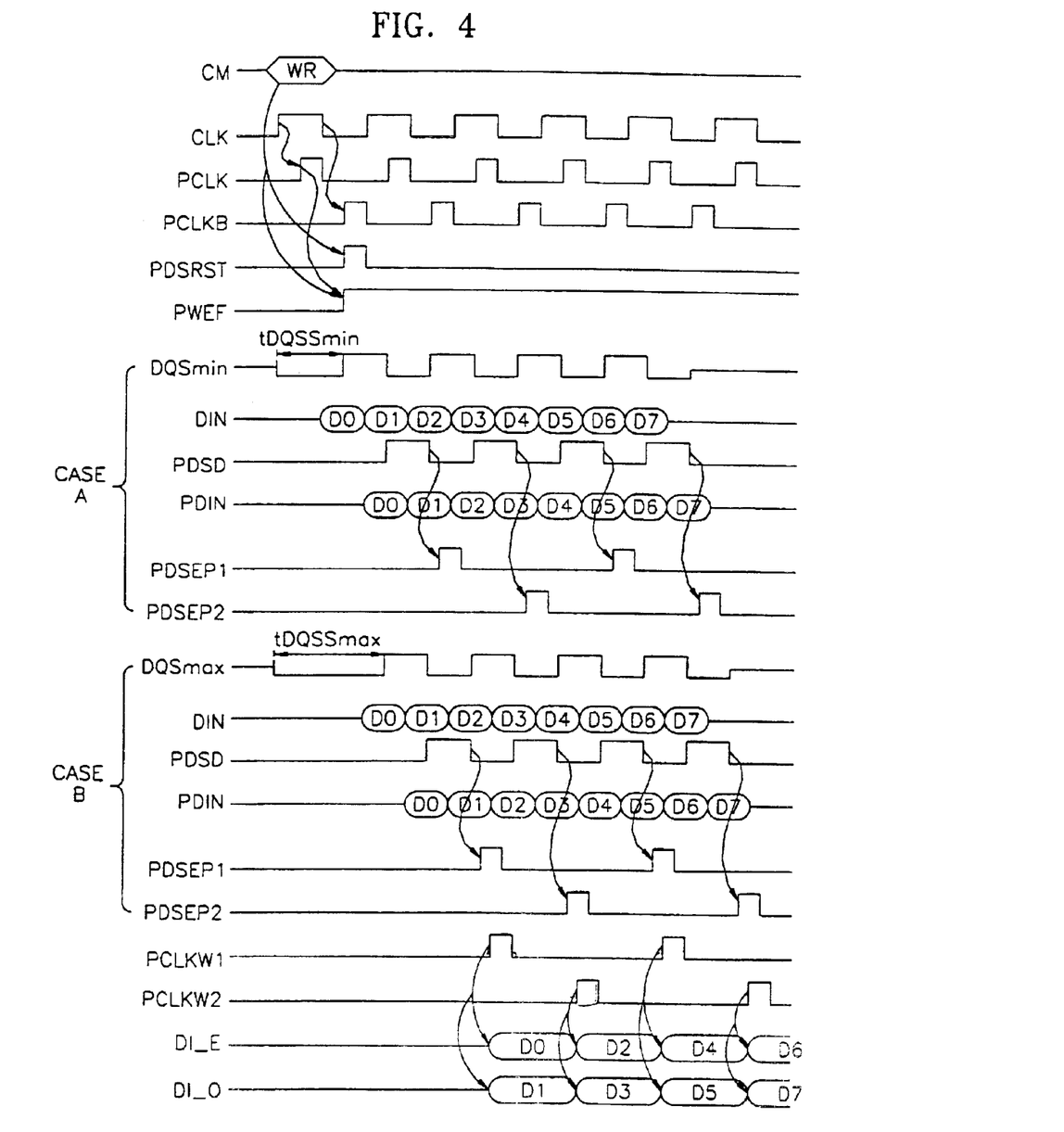
FIG. 4 is a timing diagram of data input buffers of FIG. 3.

FIG. 4 is a timing diagram of the data input buffer of FIG. 3. Hereinafter, write operations of the data input buffer 30 according to the present invention will be described in detail with reference to FIGS. 3 and 4, taking Cases A and B as examples.

Referring to FIG. 4, serial data bits PDIN denotes buffered serial data bits PIN, and internal data strobe signal PDSD denotes a buffered data strobe DQS. Control signals PCLK, PCKLB, PDSRST, PDSEP1, PDSEP2, PCLKW1, and PLCKW2 are pulses having a predetermined width as shown in FIG. 4. In detail, the first internal clock signal PCLK is a pulse generated in response to a rising edge of a clock signal CLK, and the second internal clock signal PCLKB is a pulse generated in response to a falling edge of the clock signal CLK.

The data input buffer 30 is reset in response to the reset signal PDSRST, which is generated in response to a write command WR, and a write order control signal PWEF is activated, i.e., its level becomes high, in response to rising edges of the write command WR and the first internal clock signal PCLK.

The write order control signal PWEF may be deactivated, i.e., its level becomes low, in response to the write command WR and the first internal clock signal PCLK. Here, the write order control signal PWEF is a control signal that may selectively allow only odd data bits such as D0, D2, D4 or D6 to be written.

Referring to Case A, DQSmin is the minimum tDQSS, and signals are described with reference to a clock signal CLK. A first control signal PDSEP1 is a pulse generated in response to an odd falling edge of an internal data strobe signal PDSD, and a second control signal PDSEP2 is a pulse generated in response to an even falling edge of the internal data strobe signal PDSD.

The first control signal PDSEP1 or the second control signal PDSEP2 can be generated in response to a falling edge or rising edge of the internal data strobe signal PDSD. Preferably, the first and second control signals PDSEP1 and PDSEP2 are alternately activated with a predetermined time difference therebetween.

Here, for the sake of convenience, it is assumed that the serial data bits PDIN includes eight data bits D0 through D7, and each signal is activated/deactivated with a timing sequence. First, when the internal data strobe signal PDSD reaches a low level, a transmission gate 301 of FIG. 3 outputs the first data bit D0 to node A. Next, in a case where the level of the internal data strobe signal PDSD changes from low to high, the transmission gate 303 transmits the first data bit D0 contained at node A to node B, and a transmission gate 307 transmits the second data bit D1 to node D.

Thereafter, when the level of the internal data strobe signal PDSD changes from high to low, a transmission gate 305 transmits the first data bit D0 contained at node B to node C. The transmission gate 301 transmits the third data bit D2 to node A, and the transmission gate 309 transmits the second data bit D1 contained at node D to node E.

In other words, the conversion circuit 31 converts a first group of serial data bits including a plurality of data bits D0 and D1 into a first group of parallel data bits in response to the internal data strobe signal PDSD, and then converts a second group of serial data bits including a plurality of data bits D2 and D3 into a second group of parallel data bits in response to the internal data strobe signal PDSD.

More specifically, the conversion circuit 31 outputs one of odd data bits D0, D2, D4 and D6, which constitute the serial data bits PDIN, to the node C in response to the internal data strobe signal PDSD, and outputs one of even data bits D1, D3, D5 and D7, which constitute the serial data bits PDIN, to the node E in response to the internal data strobe signal PDSD. Here, inversion/non-inversion of data bits by inverters will be omitted, because it can be derived by those skilled in the art with reference to FIG. 3.

Then, a transmission gate 311 outputs the first data bit D0 at node C to node F in response to the first control signal PDSEP1, and a transmission gate 313 outputs the second data bit D1 at the node E to node G in response to the first control signal PDSEP1.

In the event that the level of the internal data strobe signal PDSD changes from low to high, the transmission gate 303 transmits the third data bit D2 at node A to node B, and the transmission gate 307 outputs the fourth data bit D3 to node D.

If the first write signal PCLKW1 is activated, the level of node J becomes high in response to the first write signal PCLKW1 and the write order control signal PWEF, and therefore, the transmission gate 319 outputs the first data bit D0 at node F to node O and the transmission gate 321 outputs the second data bit D1 at node G to node P.

That is, the first latch circuit 33 receives the first data bit D0 and the second data bit D1 in response to the first control signal PDSEP1, and outputs the first data bit D0 and the second data bit D1 to node O and node P, respectively, in response to the first write signal PCLKW1 and the write order control signal PWEF. The first output terminal DI_E of the output latch 37 outputs the first data bit D0, and the second output terminal DI_O of the output latch 37 outputs the second data bit D1.

The first latch circuit 33 latches data bits at nodes C and E in response to the first control signal PDSEP1. The first latch circuit 33 outputs a data bit latched at node F, e.g., D0 or D4, to node O in response to the first write signal PCLKW1. The first latch circuit 33 also outputs a data bit latched at node G, e.g., D1 or D5, to node P in response to the first write signal PCLKW1.

However, in a case where the write order control signal PWEF is deactivated or goes low in response to rising edges of the write command CM and the first internal clock signal PCLK, the level of the node K becomes high. As a result, the first data bit D0 at node F is transmitted to node P via a transmission gate 323, and the second data bit D1 at node G is transmitted to node O via a transmission gate 325.

When the level of the internal data strobe signal PDSD changes from high to low, the transmission gate 305 transmits the third data bit D2 at node B to node C, the transmission gate 309 transmits the fourth data bit D3 at node D to node E, and the transmission gate 301 transmits the fifth data bit D4 to node A. Then, if the second control signal PDSEP2 is activated, a transmission gate 315 transmits the third data bit D2 at node C to node H, and a transmission gate 317 transmits the fourth data bit D3 at node E to node I.

The level of a node L goes high in response to the second write signal PCLKW2 and the write order control signal PWEF, and a transmission gate 327 outputs the third data bit D2 at node H to node O. Similarly, a transmission gate 329 outputs the fourth data bit D3 at node I to node P. That is, the second latch circuit 35 receives the third data bit D2 and the fourth data bit D3 in response to the second control signal PDSEP2, respectively, and outputs the third data bit D2 and the fourth data bit D3 to the nodes O and P in response to the second write signal PCLKW2 and the write order control signal PWEF, respectively. The first output terminal DI_E of the output latch 37 outputs the third data bit D2, and the second output terminal DI_0 of the output latch 37 outputs the fourth data bit D3. The second latch circuit 35 latches data bits at nodes C and E in response to the second control signal PDSEP2 and outputs data bit D2 or D6 latched at node H to the node O in response to the second write signal PCLKW1 and outputs data bit D3 or D7 latched at node G to node P.

However, in the event that the write order control signal PWEF is deactivated in response to rising edges of the write command CM and the second internal clock signal PCLK, the level of node M becomes high. Thus, the third data bit D2 at node H is transmitted to node P via a transmission gate 331, and the fourth data bit D3 at node I is transmitted to node O via a transmission gate 333. Therefore, the first and second data bits D0 and D1 are latched by the first latch circuit 33 in response to the first control signal PDSEP1 and output in response to the first write signal PCLKW1. The third and fourth data bits D2 and D3 are latched by the second latch circuit 35 in response to the second control signal PDSEP2 and output in response to the first write signal PCLKW1.

Preferably, the first write signal PCLKW1 is activated after the first control signal PDSEP1 and a predetermined time passes, the second control signal PDSEP2 is activated after the first write signal PCLKW1 is activated and a predetermined time passes, and the second write signal PCLKW2 is activated after the second control signal PDSEP2 is activated and a predetermined time passes. In conclusion, the first write signal PCLKW1 and the second write signal PCLKW2 are alternately activated with a predetermined time difference therebetween.

In response to the first write signal PCLKW1, the first latch circuit 33 simultaneously outputs the first and second data bits D0 and D1 out of the serial data bits PDIN to the output latch 37, and simultaneously outputs the fifth and sixth data bits D4 and D5 to the output latch 37. Also, in response to the second write signal PCLKW2, the second latch circuit 35 simultaneously outputs the third and fourth data bits D2 and D3 out of the serial data bits PDIN to the output latch 37 and simultaneously outputs the seventh and eighth data bits D6 and D7 to the output latch 37.

The first and second output terminals DI_E and DI_O of the output latch 37 respectively maintain the first and second data bits D0 and D1 in response to activation of the first write signal PCLKW1 until the second write signal PCLKW2 is activated. The first and second output terminals DI_E and DI_O of the output latch 37 then maintain the third and fourth data bits D2 and D3 responsive to activation of the second write signal PCLKW2, until the first write signal PCLKW1 is activated.

Referring to Case B, DQSmax denotes the maximum DQSmax, and signals DIN, PDSD, PDIN, PDSEP1 and PDSEP2 are generated according to the same mechanism as the signals DIN, PDSD, PDIN, PDSEP1 and PDSEP2 in Case A. Also, a process of outputting D0 through D3 in Case B is the same as that of outputting D0 through D3 in Case A.

The conversion circuit 31 converts the serial data bits PDIN into parallel data bits in response to the internal data strobe signal PDSD. The first group of data bits D0 and D1 out of the serial data bits PDIN is converted into parallel data bits in response to the internal data strobe signal PDSD, the first latch circuit 33 receives the first group of data bits D0 and D1 in response to the first control signal PDSEP1, and the first group of data bits D0 and D1 is simultaneously output to the output latch 37 in response to the first write signal PCLKW1.

Then, if the second group of data bits D2 and D3 out of the serial data bits PDIN is converted into parallel data bits in response to the internal data strobe signal PDSD, the second latch circuit 35 receives the second group of data bits D2 and D3 in response to the second control signal PDSEP2 and simultaneously outputs the second group of data bits D2 and D3 in response to the second write signal PCLKW2. In the serial data bits PDIN, the second group of data bits D2 and D3 are output right after the output of the first group of data bits D0 and D1.

Next, a third group of data bits, e.g., D4 and D5, out of the serial data bits PDIN is converted into parallel data bits in response to the internal data strobe signal PDSD, the first latch circuit 33 receives the third group of data bits D4 and D5 in response to the first control signal PDSEP1, and the third group of data bits D4 and D5 is simultaneously output to the output latch 37 in response to the first write signal PCLKW1. In the serial data bits PDIN, the third group of data bits D4 and D5 is simultaneously output right after the output of the second group of data bits D2 and D3.

Signals that control data transmission are activated in the order of the first control signal PDSEP1, the first write signal PCLKW1, the second control signal PDSEP2, the second write signal PCLKW2, the first control signal PDSEP1, the first write signal PCLKW1, and so on. The output terminals DI_E and DI_O of the output latch 37 output the first group of data bits, the second group of data bits, the third group of data bits, and so on.

As described above, a data input methods and a data input buffers according to embodiments of the present invention can improve a tDQSS window. Therefore, the data input buffer can successfully perform write operations at both the minimum tDQSS and the maximum tDQSS, with a reduced layout area.

While this invention has been particularly described with reference to particular embodiments thereof, it will be understood by those skilled in the art that various changes in form and details may be made therein without departing from the spirit and scope of the invention as defined by the appended claims.

According to embodiments of the present invention, data input buffers can be provided that can improve a tDQSS while occupying reduced layout area. For example, a data input buffer can be provided including a conversion circuit, and first and second transmission circuits. The conversion circuit can be configured to convert a first group of serial data bits, which has a plurality of data, into a first group of parallel data bits in response to a data strobe signal, and then, to convert a second group of serial data bits, which has a plurality of data, into a second group of parallel data bits in response to the data strobe signal. The first transmission circuit can be configured to transmit each of the parallel data bits of the first group to each of a plurality of corresponding output terminals in response to a first write signal. The second transmission circuit can be configured to transmit each of the parallel data bits of the second group to each of a plurality of corresponding output terminals in response to a second write signal. Moreover, the first and second write signals can be alternately activated with a predetermined time difference.

The serial data bits of the first group can be output right after the output of the serial data bits of the second group, and the data input buffer can further include an output latch for latching data bits in each output terminal, wherein the output latch latches a respective data bit in each output terminal until the first write signal is activated and then the second write signal is activated, or until the second write signal is activated and then the first write signal is activated.

According to additional embodiments of the present invention, a data input buffer can include a conversion circuit configured to output odd data bits out from a plurality of serial data bits to a first node in response to a data strobe signal, and to output even data bits from the serial data bits to a second node in response to a data strobe signal. A first latch circuit can be configured to latch respective data bits in the first and second nodes in response to a first control signal, respectively, and to simultaneously output each latched data bit in response to a first write signal. A second latch circuit can be configured to latch the data bits in the first and second nodes in response to a second control signal, respectively, and to simultaneously output each latched data bit in response to a second write signal.

The first and second write signals can be alternately activated with a predetermined time difference. In addition, the data input buffer can further include an output latch configured to latch data bits output from the first or second latch circuit, wherein the output latch latches the data bits output from the first or second latch circuit until the first write signal is activated and then the second write signal is activated, or until the second write signal is activated and then the first write signal is activated. The first and second control signals can be alternately activated with a predetermined time difference.

According to yet additional embodiments of the present invention, a data input method can include converting a first group of serial data bits, which has a plurality of data, into a first group of parallel data bits in response to a data strobe signal, and then, converting a second group of data bits, which has a plurality of data, into a second group of parallel data bits in response to the data strobe signal. Each of the parallel data bits of the first group can be transmitted to each of a plurality of corresponding output terminals in response to a first write signal. Each of the parallel data bits of the second group can be transmitted to each of a plurality of corresponding output terminals in response to a second write signal, wherein the first and second write signals are alternately activated with a predetermine time difference.

According to still additional embodiments of the present invention, a data input method can include outputting odd data bits out of a plurality of serial data bits to a first node in response to a data strobe signal, and outputting even data bits out of the serial data bits to a second node in response to the data strobe signal. Data bits can be latched at the first and second nodes in response to a first control signal and each latched data bit can be simultaneously output in response to a first write signal. The data bits can be latched at the first and second nodes in response to a second control signal, and each latched data bit can be simultaneously output in response to a second write signal.

It should be noted that many variations and modifications might be made to the embodiments described above without substantially departing from the principles of the present invention. All such variations and modifications are intended to be included herein within the scope of the present invention, as set forth in the following claims.

What is claimed is:

1. A method of buffering data for an integrated circuit memory device, the method comprising:
   converting a plurality of serial data bits into a parallel format such that even ones of the plurality of serial data bits are provided at a first conversion output node and odd ones of the plurality of serial data bits are provided at a second conversion output node wherein a first odd data bit, a first even data bit, a second odd data bit, and a second even data bit comprise four consecutive data bits of the plurality of serial data bits;
   providing the first even and odd data bits from the first and second conversion output nodes at first and second latch output nodes during a first period of time;
   providing the second even and odd data bits from the first and second conversion output nodes at third and fourth latch output nodes during a second period of time wherein the first and second periods of time are non-overlapping;
   latching the first even and odd data bits at first and second buffer output nodes responsive to providing the first even and odd data bits at the first and second latch output nodes; and
   latching the second even and odd data bits at the first and second buffer output nodes responsive to providing the second even and odd data bits at the third and fourth latch output nodes.

2. A method according to claim 1 wherein converting the plurality of serial data bits into a parallel format comprises converting the plurality of serial data bits responsive to a data strobe.

3. A method according to claim 2 wherein converting the plurality of serial data bits into a parallel format further comprises converting the plurality of serial data bits responsive to rising and falling edges of the data strobe.

4. A method according to claim 1 wherein the first even and odd data bits are provided at the first and second latch output nodes responsive to a first control signal followed by a first write signal, and wherein the second even and odd data bits are provided at the third and fourth latch output nodes responsive to a second control signal followed by a second write signal.

5. A method according to claim 4 wherein the first control signal precedes the second control signal.

6. A method according to claim 4 wherein the first write signal precedes the second write signal.

7. A method according to claim 4 wherein the first control signal precedes the first write signal, wherein the first write signal precedes the second control signal, and wherein the second control signal precedes the second write signal.

8. A method according to claim 1 further comprising:
providing third even and odd data bits at the first and second latch output nodes during a third period of time;
providing fourth even and odd data bits at the third and fourth latch output nodes during a fourth period of time wherein the first, second, third, and fourth periods of time are non-overlapping and wherein the first period of time precedes the second period of time, the second period of time precedes the third period of time, and the third period of time precedes the fourth period of time;
latching the third even and odd data bits at the first and second buffer outputs responsive to providing the third even and odd data bits at the first and second latch output nodes; and
latching the fourth even and odd data bits at the first and second buffer outputs responsive to providing the fourth even and odd data bits at the third and fourth latch output nodes.

9. A method according to claim 8 wherein the first odd data bit comprises a first of the plurality of serial data bits, wherein the first even data bit comprises a second of the plurality of serial data bits, wherein the second odd data bit comprises a third of the plurality of serial data bits, wherein the second even data bit comprises a fourth of the plurality of serial data bits, wherein the third odd data bit comprises a fifth of the plurality of serial data bits, wherein the third even data bit comprises a sixth of the plurality of serial data bits, wherein the fourth odd data bit comprises a seventh of the plurality of serial data bits, wherein the fourth even data bit comprises an eighth of the plurality of serial data bits, and wherein the first through eighth of the plurality of serial data bits are sequential ones of the plurality of serial data bits.

10. A method according to claim 1 further comprising:
writing the first and second even and odd data bits to respective memory cells of a memory cell array responsive to latching the first and second even and odd data bits.

11. A data input buffer for an integrated circuit memory device, the data input buffer comprising:
a conversion circuit comprising a buffer input and first and second conversion circuit outputs, wherein the conversion circuit receives a plurality of serial data bits at the conversion circuit input and converts the plurality of serial data bits into a parallel format such that even ones of the plurality of serial data bits are provided at the first conversion circuit output and odd ones of the plurality of serial data bits are provided at the second conversion circuit output;
a first latch circuit comprising first and second latch circuit inputs and first and second latch circuit outputs, wherein the first latch circuit is configured to receive a first even data bit from the first conversion circuit output at the first latch circuit input, to receive a first odd data bit from the second conversion circuit output at the second latch circuit input, and to provide the first even and odd data bits at the first and second latch circuit outputs during a first period of time;
a second latch circuit comprising third and fourth latch circuit inputs and third and fourth latch circuit outputs, wherein the second latch circuit is configured to receive a second even data bit from the first conversion circuit output at the third latch circuit input, to receive a second odd data bit from the second conversion circuit output at the fourth latch circuit input, and to provide the second even and odd data bits at the third and fourth latch circuit outputs during a second period of time wherein the first and second periods of time are non-overlapping; and
an output latch comprising first and second buffer outputs, wherein the output latch is configured to latch the first even and odd data bits at the first and second buffer outputs responsive to the first latch circuit providing the first even and odd data bits, and to latch the second even and odd data bits at the first and second buffer outputs responsive to the second latch circuit providing the second even and odd data bits.

12. A data input buffer according to claim 11 wherein the conversion circuit is further configured to receive the plurality of serial data bits responsive to a data strobe.

13. A data input buffer according to claim 12 wherein the conversion circuit is further configured to receive the plurality of serial data bits responsive to rising and falling edges of the data strobe.

14. A data input buffer according to claim 11 wherein the first latch circuit is further configured to receive the first even and odd data bits responsive to a first control signal, and wherein the second latch circuit is further configured to receive the second even and odd data bits responsive to a second control signal.

15. A data input buffer according to claim 14 wherein the first control signal precedes the second control signal.

16. A data input buffer according to claim 11 wherein the first latch circuit is further configured to provide the first even and odd data bits at the first and second latch outputs responsive to a first write signal, and wherein the second latch circuit is further configured to provide the second even and odd data bits at the third and fourth latch outputs responsive to a second write signal.

17. A data input buffer according to claim 16 wherein the first write signal precedes the second write signal.

18. A data input buffer according to claim 11:
wherein the first latch circuit is further configured to receive a third even data bit from the first conversion circuit output at the first latch circuit input, to receive a third odd data bit from the second conversion circuit output at the second latch circuit input, and to provide the third even and odd data bits at the first and second latch circuit outputs during a third period of time;
wherein the second latch circuit is further configured to receive a fourth even data bit from the first conversion circuit output at the third latch circuit input, to receive a fourth odd data bit from the second conversion circuit output at the fourth latch circuit input, and to provide the fourth even and odd data bits at the third and fourth latch circuit outputs during a fourth period of time wherein the first, second, third, and fourth periods of time are non-overlapping and wherein the first period of time precedes the second period of time, the second period of time precedes the third period of time, and the third period of time precedes the fourth period of time; and
wherein the output latch is further configured to latch the third even and odd data bits at the first and second buffer outputs responsive to the first latch circuit providing the third even and odd data bits, and to latch the fourth even and odd data bits at the first and second buffer outputs responsive to the second latch circuit providing the fourth even and odd data bits.

19. A data input buffer according to claim 18 wherein the first odd data bit comprises a first of the plurality of serial data bits, wherein the first even data bit comprises a second of the plurality of serial data bits, wherein the second odd data bit comprises a third of the plurality of serial data bits, wherein the second even data bit comprises a fourth of the plurality of serial data bits, wherein the third odd data bit comprises a fifth of the plurality of serial data bits, wherein the third even data bit comprises a sixth of the plurality of serial data bits, wherein the fourth odd data bit comprises a seventh of the plurality of serial data bits, wherein the fourth even data bit comprises an eighth of the plurality of serial data bits, and wherein the first through eighth of the plurality of serial data bits are received sequentially at the buffer input.

20. A data input buffer according to claim 11 wherein the first and second buffer outputs are coupled with a memory cell array to write the first and second even and odd data bits to respective memory cells of the memory cell array.

21. A data input buffer comprising
a conversion circuit for converting a first group of serial data, which has a plurality of data, into a first group of parallel data in response to a data strobe signal, and then, converting a second group of serial data, which has a plurality of data, into a second group of parallel data in response to the data strobe signal;
a first transmission circuit for transmitting each of the parallel data of the first group to each of a plurality of corresponding output terminals in response to a first write signal; and
a second transmission circuit for transmitting each of the parallel data of the second group to each of a plurality of corresponding output terminals in response to a second write signal,
wherein the first and second write signals are alternately activated with a predetermined time difference.

22. The data input buffer of claim 21, wherein the serial data of the first group are output right after the output of the serial data of the second group.

23. The data input buffer of claim 21 further comprising an output latch for latching data in each output terminal,
wherein the output latch latches data in each output terminal until the first write signal is activated and then the second write signal is activated, or until the second write signal is activated and then the first write signal is activated.

24. A data input buffer comprising:
a conversion circuit for outputting odd data bits out of a plurality of serial data bits to a first node in response to a data strobe signal, and outputting even data bits out of the serial data bits to a second node in response to the data strobe signal;
a first latch circuit for latching a first odd data bit from the first node and for latching a first even data bit from the second node in response to a first control signal, respectively, and simultaneously outputting each of the first odd and even latched data bits in response to a first write signal; and
a second latch circuit for latching a second odd data bit from the first node and for latching a second even data bit from the second node nodes in response to a second control signal, respectively, and simultaneously outputting each of the second odd and even latched data bits in response to a second write signal.

25. A data input buffer comprising:
a conversion circuit for outputting odd data out of a plurality of serial data to a first node in response to a data strobe signal, and outputting even data out of the serial data to a second node in response to the data strobe signal;
a first latch circuit for latching data in the first and second nodes in response to a first control signal, respectively, and simultaneously outputting each latched data in response to a first write signal; and
a second latch circuit for latching the data in the first and second nodes in response to a second control signal, respectively, and simultaneously outputting each latched data in response to a second write signal;
wherein the first and second write signals are alternately activated with a predetermined time difference.

26. The data input buffer of claim 25 further comprising an output latch for latching data output from the first or second latch circuit,
wherein the output latch latches the data output from the first or second latch circuit until the first write signal is activated and then the second write signal is activated, or until the second write signal is activated and then the first write signal is activated.

27. A data input buffer comprising:
a conversion circuit for outputting odd data out of a plurality of serial data to a first node in response to a data strobe signal, and outputting even data out of the serial data to a second node in response to the data strobe signal;
a first latch circuit for latching data in the first and second nodes in response to a first control signal, respectively, and simultaneously outputting each latched data in response to a first write signal; and
a second latch circuit for latching the data in the first and second nodes in response to a second control signal, respectively, and simultaneously outputting each latched data in response to a second write signal;
wherein the first and second control signals are alternately activated with a predetermined time difference.

28. A data input method comprising:
converting a first group of serial data, which has a plurality of data, into a first group of parallel data in response to a data strobe signal, and then, converting a second group of data, which has a plurality of data, into a second group of parallel data in response to the data strobe signal;
transmitting each of the parallel data of the first group to each of a plurality of corresponding output terminals in response to a first write signal; and
transmitting each of the parallel data of the second group to each of a plurality of corresponding output terminals in response to a second write signal,
wherein the first and second write signals are alternately activated with a predetermine time difference.

29. The data input method of claim 28, wherein the first group of the serial data is output right after the output of the second group of the serial data.

30. The data input method of claim 28 further comprising latching data in each output terminal,
wherein data in each output terminal is latched until the first write signal is activated and then the second write signal is activated, or until the second write signal is activated and the first write signal is activated.

31. A data input method comprising:
outputting odd data bits out of a plurality of serial data bits to a first node in response to a data strobe signal, and outputting even data bits out of the serial data to a second node in response to the data strobe signal;
latching a first odd data bit from the first node at a first latch circuit and latching a first even data bit from the second node at the first latch circuit in response to a first control signal and simultaneously outputting each of the first odd and even latched data bits in response to a first write signal; and latching a second odd data bit from the first node at a second latch circuit and latching a second even data bit from the second node at the second latch circuit in response to a second control signal, and simultaneously outputting each of the second odd and even latched data bits in response to a second write signal.

32. A data input method comprising:

outputting odd data out of a plurality of serial data to a first node in response to a data strobe signal, and outputting even data out of the serial data to a second node in response to the data strobe signal;

latching data at the first and second nodes in response to a first control signal and simultaneously outputting each latched data in response to a first write signal; and latching the data at the first and second nodes in response to a second control signal, and simultaneously outputting each latched data in response to a second write signal;

wherein the first and second write signals are alternately activated with a time difference.

33. A method of buffering data for an integrated circuit memory device, the method comprising:

converting a plurality of serial data bits into a parallel format such that even ones of the plurality of serial data bits are provided at a first conversion output node and odd ones of the plurality of serial data bits are provided at a second conversion output node wherein a first odd data bit, a first even data bit, a second odd data bit, and a second even data bit comprise four consecutive data bits of the plurality of serial data bits;

providing the first even and odd data bits from the first and second conversion output nodes at first and second latch output nodes;

providing the second even and odd data bits from the first and second conversion output nodes at third and fourth latch output nodes;

latching the first even and odd data bits at first and second buffer output nodes responsive to providing the first even and odd data bits at the first and second latch output nodes; and latching the second even and odd data bits at the first and second buffer output nodes responsive to providing the second even and odd data bits at the third and fourth latch output nodes.

34. A method according to claim 33 wherein converting the plurality of serial data bits into a parallel format comprises converting the plurality of serial data bits responsive to a data strobe.

35. A method according to claim 34 wherein converting the plurality of serial data bits into a parallel format further comprises converting the plurality of serial data bits responsive to rising and falling edges of the data strobe.

36. A method according to claim 33 wherein the first even and odd data bits are provided at the first and second latch output nodes responsive to a first control signal followed by a first write signal, and wherein the second even and odd data bits are provided at the third and fourth latch output nodes responsive to a second control signal followed by a second write signal.

37. A data input buffer for an integrated circuit memory device, the data input buffer comprising:

a conversion circuit comprising a buffer input and first and second conversion circuit outputs, wherein the conversion circuit receives a plurality of serial data bits at the conversion circuit input and converts the plurality of serial data bits into a parallel format such that even ones of the plurality of serial data bits are provided at the first conversion circuit output and odd ones of the plurality of serial data bits are provided at the second conversion circuit output;

a first latch circuit comprising first and second latch circuit inputs and first and second latch circuit outputs, wherein the first latch circuit is configured to receive a first even data bit from the first conversion circuit output at the first latch circuit input, to receive a first odd data bit from the second conversion circuit output at the second latch circuit input, and to provide the first even and odd data bits at the first and second latch circuit outputs;

a second latch circuit comprising third and fourth latch circuit inputs and third and fourth latch circuit outputs, wherein the second latch circuit is configured to receive a second even data bit from the first conversion circuit output at the third latch circuit input, to receive a second odd data bit from the second conversion circuit output at the fourth latch circuit input, and to provide the second even and odd data bits at the third and fourth latch circuit outputs; and an output latch comprising first and second buffer outputs, wherein the output latch is configured to latch the first even and odd data bits at the first and second buffer outputs responsive to the first latch circuit providing the first even and odd data bits, and to latch the second even and odd data bits at the first and second buffer outputs responsive to the second latch circuit providing the second even and odd data bits.

38. A data input buffer according to claim 37 wherein the conversion circuit is further configured to receive the plurality of serial data bits responsive to a data strobe.

39. A data input buffer according to claim 38 wherein the conversion circuit is further configured to receive the plurality of serial data bits responsive to rising and falling edges of the data strobe.

40. A data input buffer according to claim 37 wherein the first latch circuit is further configured to receive the first even and odd data bits responsive to a first control signal, and wherein the second latch circuit is further configured to receive the second even and odd data bits responsive to a second control signal.

41. A data input buffer according to claim 37 wherein the first latch circuit is further configured to provide the first even and odd data bits at the first and second latch outputs responsive to a first write signal, and wherein the second latch circuit is further configured to provide the second even and odd data bits at the third and fourth latch outputs responsive to a second write signal.

* * * * *